US012588459B2

(12) United States Patent
Dogome

(10) Patent No.: US 12,588,459 B2
(45) Date of Patent: Mar. 24, 2026

(54) GATE VALVE APPARATUS AND SEMICONDUCTOR MANUFACTURING APPARATUS

(71) Applicant: Tokyo Electron Limited, Tokyo (JP)

(72) Inventor: Masahiro Dogome, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 18/129,473

(22) Filed: Mar. 31, 2023

(65) Prior Publication Data

US 2023/0317480 A1 Oct. 5, 2023

(30) Foreign Application Priority Data

Mar. 31, 2022 (JP) ................................. 2022-061309

(51) Int. Cl.
| | |
|---|---|
| *H01L 21/67* | (2006.01) |
| *H01J 37/32* | (2006.01) |
| *H01L 21/677* | (2006.01) |
| *H01L 21/687* | (2006.01) |

(52) U.S. Cl.
CPC .. *H01L 21/67196* (2013.01); *H01J 37/32513* (2013.01); *H01J 37/32899* (2013.01); *H01L 21/67739* (2013.01); *H01L 21/68792* (2013.01)

(58) Field of Classification Search
CPC . F16K 3/06; H01J 2237/166; H01J 2237/186; H01J 37/32513; H01J 37/32899; H01L 21/67739; H01L 21/68792; H01L 21/67196
See application file for complete search history.

(56) References Cited

U.S. PATENT DOCUMENTS

| | | | | |
|---|---|---|---|---|
| 6,932,354 B2* | 8/2005 | Kane | ...................... | F16J 15/061 |
| | | | | 277/637 |
| 10,793,948 B2* | 10/2020 | Zhao | ................. | H01J 37/32807 |
| 11,488,806 B2* | 11/2022 | Noorbakhsh | ..... | H01L 21/67742 |
| 11,728,205 B2* | 8/2023 | Dogome | ............. | B25J 19/0079 |
| | | | | 414/806 |

(Continued)

FOREIGN PATENT DOCUMENTS

| | | |
|---|---|---|
| JP | S59-169476 U | 11/1984 |
| JP | S63-192222 A | 8/1988 |

(Continued)

*Primary Examiner* — Umashankar Venkatesan
(74) *Attorney, Agent, or Firm* — XSENSUS LLP

(57) ABSTRACT

A gate valve apparatus and a semiconductor manufacturing apparatus, in which a volume of a drive portion for driving a valve body is reduced, are provided. The gate valve apparatus includes a housing having an opening, a valve body configured to open and close the opening, and a drive portion configured to drive the valve body, in which the drive portion includes a first crankshaft including a first input shaft rotatably supported by a side wall of the housing and a first output shaft rotatably supported by the valve body, a second crankshaft including a second input shaft rotatably supported by the side wall of the housing and a second output shaft rotatably supported by the valve body, a rotation transmission portion configured to transmit rotation of the first input shaft to the second input shaft, and an actuator configured to rotate the first input shaft.

20 Claims, 8 Drawing Sheets

(56)     References Cited

U.S. PATENT DOCUMENTS

| | | | |
|---|---|---|---|
| 12,422,056 B2 * | 9/2025 | Frehner | ................. F16K 41/043 |
| 2002/0020344 A1 * | 2/2002 | Takano | ............ H01L 21/67745 |
| | | | 118/100 |
| 2006/0071384 A1 | 4/2006 | Lee et al. | |
| 2013/0164101 A1 * | 6/2013 | Noguchi | .......... H01L 21/67742 |
| | | | 414/217 |
| 2021/0225624 A1 * | 7/2021 | Liu | ..................... H01J 37/3405 |

FOREIGN PATENT DOCUMENTS

| | | |
|---|---|---|
| JP | H07-205062 A | 8/1995 |
| JP | 2015-81633 A | 4/2015 |
| JP | 2023-151607 A | 10/2023 |

* cited by examiner

GATE VALVE APPARATUS AND SEMICONDUCTOR MANUFACTURING APPARATUS

CROSS-REFERENCE TO RELATED APPLICATIONS

This application claims priority to Japanese Patent Application No. 2022-061309, filed on Mar. 31, 2022, the entire contents of which are incorporated herein by reference.

TECHNICAL FIELD

The present disclosure relates to a gate valve apparatus and a semiconductor manufacturing apparatus.

BACKGROUND

Patent Document 1 discloses a gate valve apparatus disposed in a plasma processing apparatus having an opening for carrying a substrate to be processed into and out of a processing container and performing a plasma process for the substrate to be processed by using plasma generated in the processing container. A drive portion for driving a valve body is provided below a housing having an opening for transferring a substrate.

PRIOR ART DOCUMENTS

Patent Documents

Patent Document 1: JP-A-2015-81633

SUMMARY

In one aspect, the present disclosure provides a gate valve apparatus and a semiconductor manufacturing apparatus in which a volume of a drive portion for driving a valve body is reduced.

In order to solve the above-described problem, according to one aspect, there is provide a gate valve apparatus including a housing having an opening, a valve body configured to open and close the opening, and a drive portion configured to drive the valve body, in which the drive portion includes a first crankshaft including a first input shaft rotatably supported by a side wall of the housing and a first output shaft rotatably supported by the valve body, a second crankshaft including a second input shaft rotatably supported by the side wall of the housing and a second output shaft rotatably supported by the valve body, a rotation transmission portion configured to transmit rotation of the first input shaft to the second input shaft, and an actuator configured to rotate the first input shaft.

According to one aspect, a gate valve apparatus and a semiconductor manufacturing apparatus, in which a volume of a drive portion that drives a valve body is reduced, can be provided.

DETAILED DESCRIPTION

Figure 1:
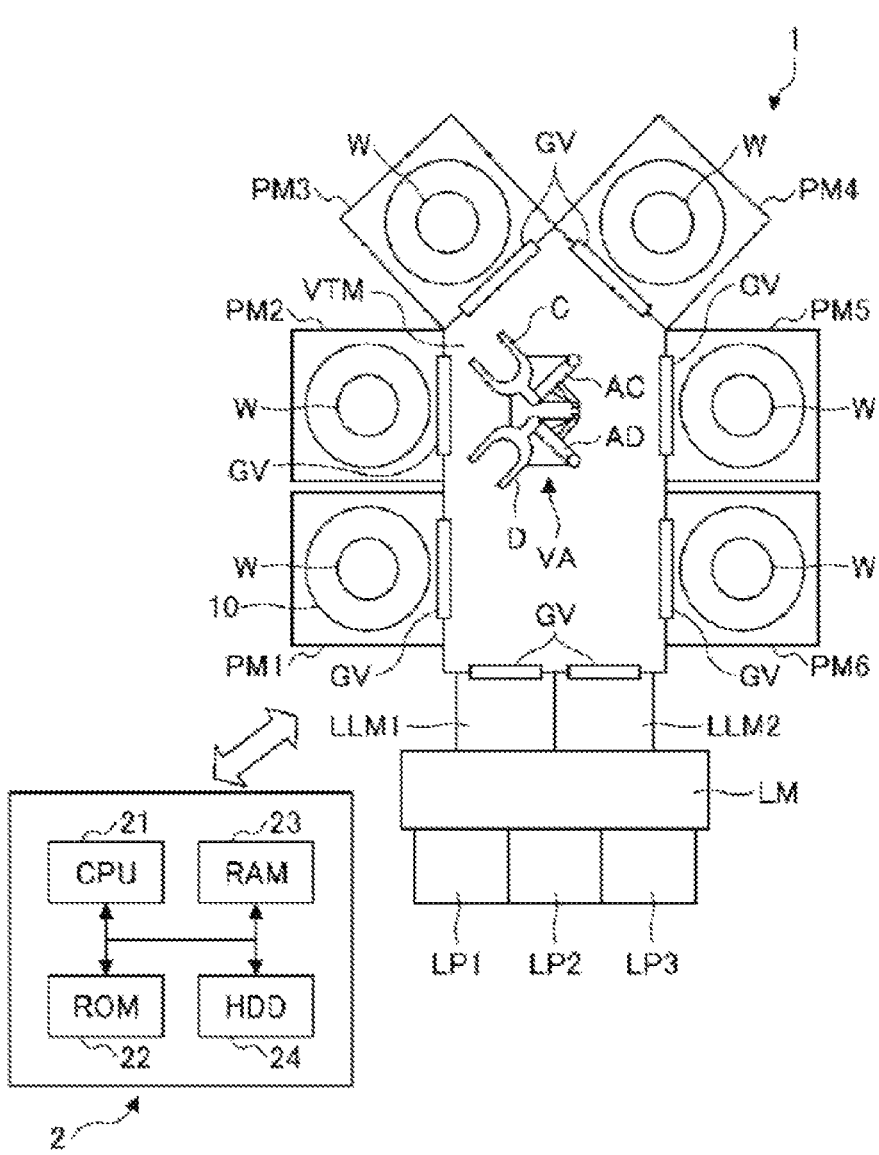
FIG. 1 is a view illustrating an example of the entire configuration of a semiconductor manufacturing apparatus according to a first embodiment.

Hereinafter, embodiments for implementing the present disclosure will be described with reference to the drawings. In the respective drawings, the same components will be denoted by the same reference numerals, and overlapping descriptions thereof may be appropriately omitted.

[Entire Configuration of Semiconductor Manufacturing Apparatus According to First Embodiment]

An example of a configuration of a semiconductor manufacturing apparatus 1 according to a first embodiment will be described with reference to FIG. 1. The semiconductor manufacturing apparatus 1 illustrated in FIG. 1 is an apparatus having a cluster structure (multi-chamber type), and a transfer chamber VTM and a substrate processing chamber PM are an example of a vacuum device.

The semiconductor manufacturing apparatus 1 of FIG. 1 includes substrate processing chambers PM (process modules) 1 to PM6, a transfer chamber VTM (vacuum transfer module), load-lock chambers LLM (load-lock module) 1 and LLM2, a loader module LM (loader module), and load ports LP (load port) 1 to LP3.

The semiconductor manufacturing apparatus 1 is controlled by a controller 2 to perform a predetermined process on a semiconductor wafer W (hereinafter, also referred to as a "wafer W") that is an example of a substrate.

The substrate processing chambers PM1 to PM6 are disposed adjacent to the transfer chamber VTM. The substrate processing chambers PM1 to PM6 are also collectively referred to as substrate processing chambers PM. The substrate processing chambers PM1 to PM6 communicate with the transfer chamber VTM by opening and closing a gate valve GV. The substrate processing chambers PM1 to PM6 each include a support 10 that supports the wafer W and are decompressed to a predetermined vacuum atmosphere, and performs a process, such as an etching process, a film formation process, a cleaning process, and an ashing process, on the wafer W therein.

A transfer device VA for transferring the wafer W is disposed inside the transfer chamber VTM. The transfer device VA includes two robot arms AC and AD that are bendable and rotatable. Picks C and D are respectively attached to distal end portions of the robot arms AC and AD. The transfer device VA can hold the wafer W in each of the picks C and D, and performs carrying-in and carrying-out of the wafer W between the substrate processing chambers PM1 to PM6 and the transfer chamber VTM according to opening and closing of the gate valve GV. Further, the transfer device VA performs carrying-in and carrying-out of the wafer W between the transfer chamber VTM and the load-lock chambers LLM1 and LLM2 according to the opening and closing of the gate valve GV.

The load-lock chambers LLM1 and LLM2 are provided between the transfer chamber VTM and the loader module LM. The load-lock chambers LLM1 and LLM2 switch between the atmospheric atmosphere and the vacuum atmosphere to transfer the wafer W from the loader module LM on the atmospheric side to the transfer chamber VTM on the vacuum side, or transfer the wafer W from the transfer chamber VTM on the vacuum side to the loader module LM on the atmospheric side. In the semiconductor manufacturing apparatus 1 according to the first embodiment illustrated in FIG. 1, the load-lock chambers LLM1 and LLM2 are disposed side by side in a horizontal direction (lateral direction) on one side wall of the transfer chamber VTM.

The loader module LM includes load ports LP1 to LP3. For example, a front opening unified pod (FOUP) in which 25 wafers W are accommodated, or an empty FOUP is placed in each of the load ports LP1 to LP3. The loader module LM carries the wafer W, which is carried out from the FOUPs inside the load ports LP1 to LP3, in either one of the load-lock chambers LLM1 and LLM2, and carries the wafer W, which is carried out from either one of the load-lock chambers LLM1 and LLM2, in the FOUP.

The controller 2 includes a central processing unit (CPU) 21, a read only memory (ROM) 22, a random access memory (RAM) 23, and a hard disk drive (HDD) 24. The controller 2 is not limited to the HDD 24, and may have another storage area such as a solid state drive (SSD). The storage areas such as the HDD 24 and the RAM 23 store a recipe in which process procedures, process conditions, transfer conditions, and the like are set.

The CPU 21 controls the process of the wafer W in the substrate processing chamber PM and controls the transfer of the wafer W according to the recipe. Further, the CPU 21 controls process processing such as gas introduction and exhaust control, measurement of particles, and the like according to the present embodiment. The HDD 24 and the RAM 23 may store, for example, programs for performing a substrate transfer process, a cleaning process, an exhaust control process, and the like. These programs may be stored in a recording medium and provided from an external device through a network.

The number of substrate processing chambers PM, the load-lock chambers LLM, and the load ports LP is not limited to the number illustrated in the present embodiment, and may be one or more.

With this configuration, the semiconductor manufacturing apparatus 1 can attach the FOUP in which the wafers W are accommodated or the empty FOUP to the load ports LP1 to LP3. Further, the semiconductor manufacturing apparatus 1 can take out from the FOUP the unprocessed wafer W accommodated in the FOUP, and transfer the wafer W to each of the substrate processing chambers PM1 to PM6 via the loader module LM, the load-lock chambers LLM1 and LLM2, and the transfer chamber VTM. Further, the semiconductor manufacturing apparatus 1 can perform a desired process on the wafer W in each of the substrate processing chambers PM1 to PM6. Further, the semiconductor manufacturing apparatus 1 can take out the processed wafer W from each of the substrate processing chambers PM1 to PM6, and accommodate the wafer W in the FOUP via the transfer chamber VTM, the load-lock chambers LLM1 and LLM2, and the loader module LM.

Figure 2:
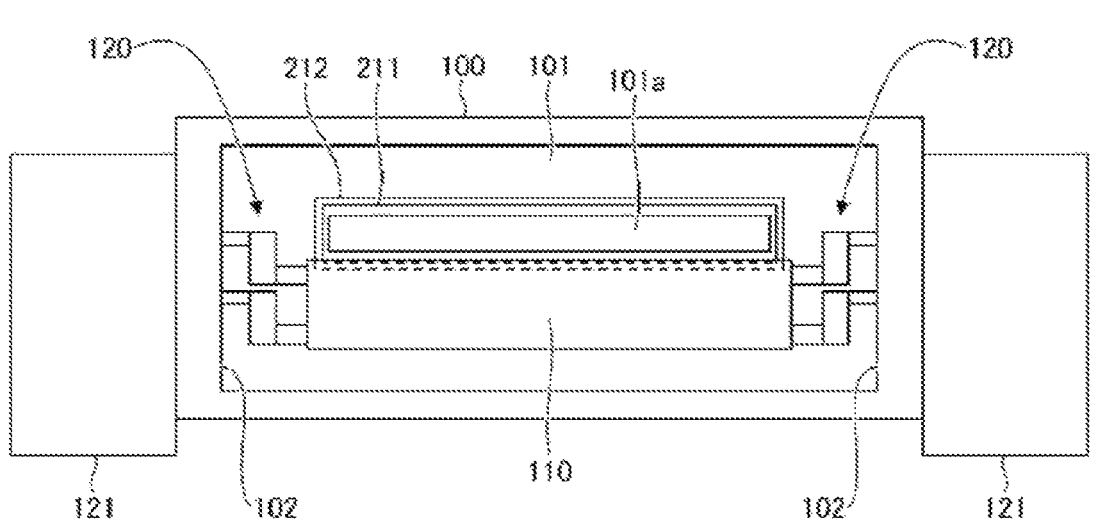
FIG. 2 is an example of a front view of a gate valve according to the present embodiment.
Figure 3:
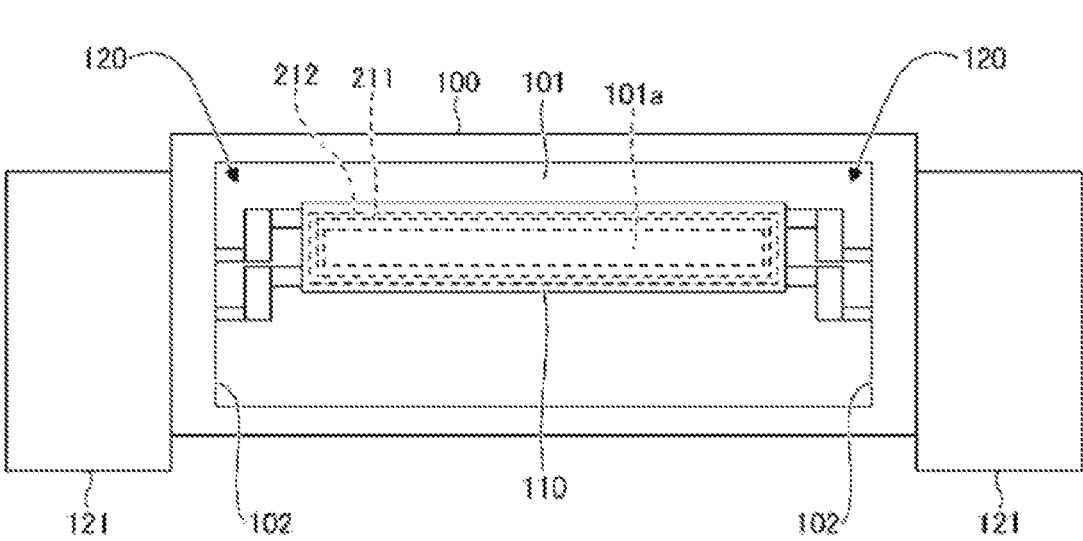
FIG. 3 is an example of a front view of the gate valve according to the present embodiment.
Figure 4:
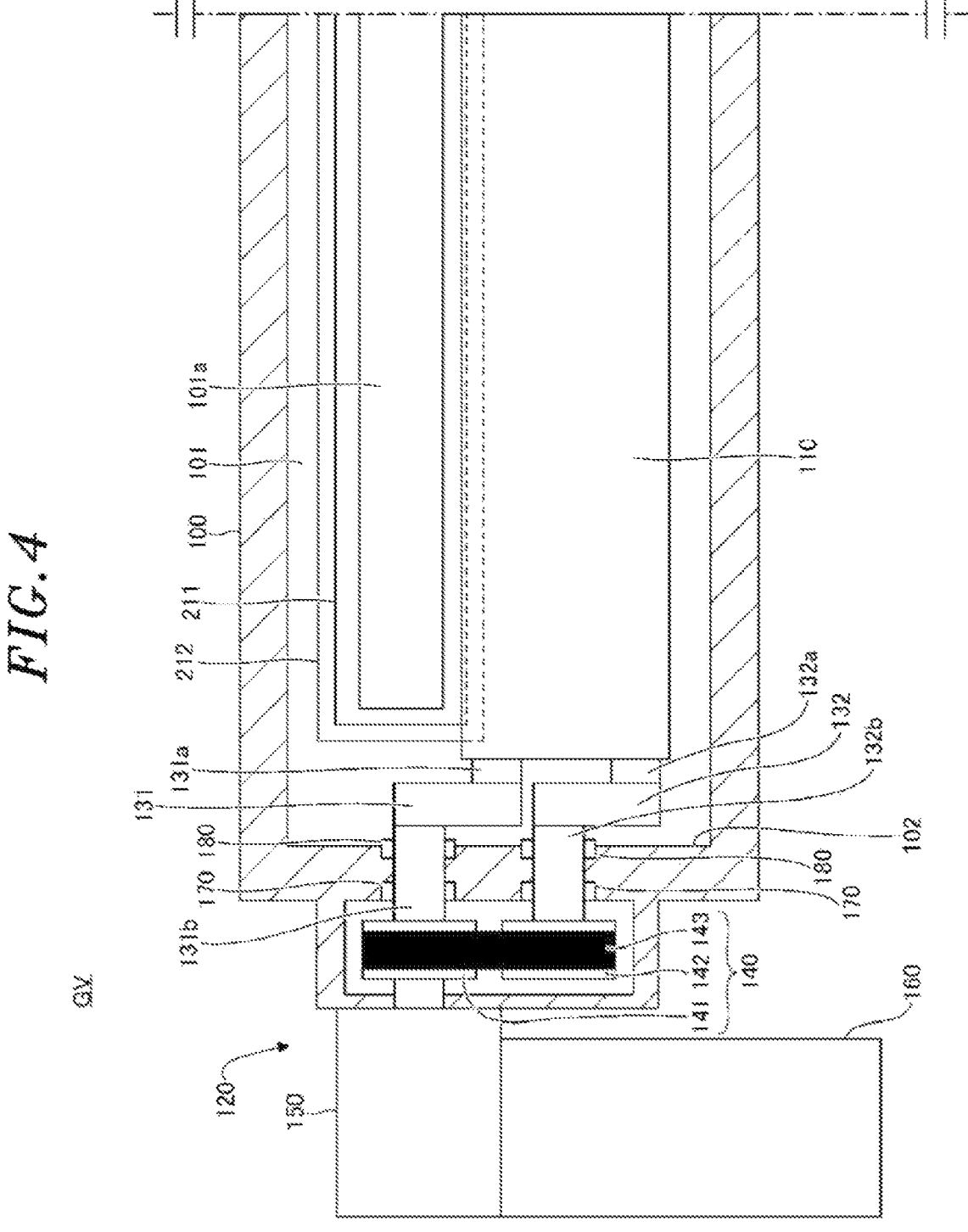
FIG. 4 is an example of a cross-sectional view of the gate valve according to the present embodiment.
Figure 5:
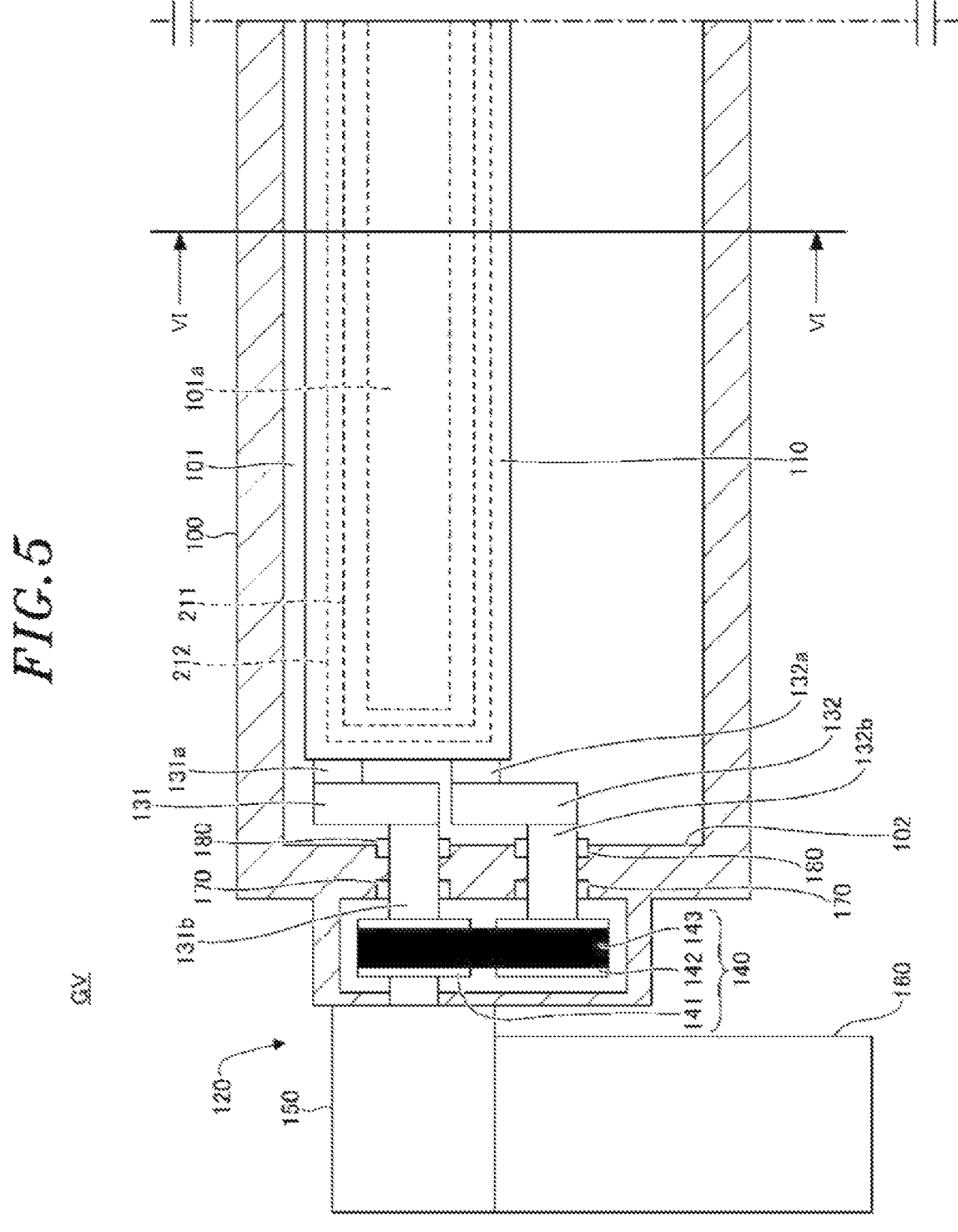
FIG. 5 is an example of a cross-sectional view of the gate valve according to the present embodiment.
Figure 6:
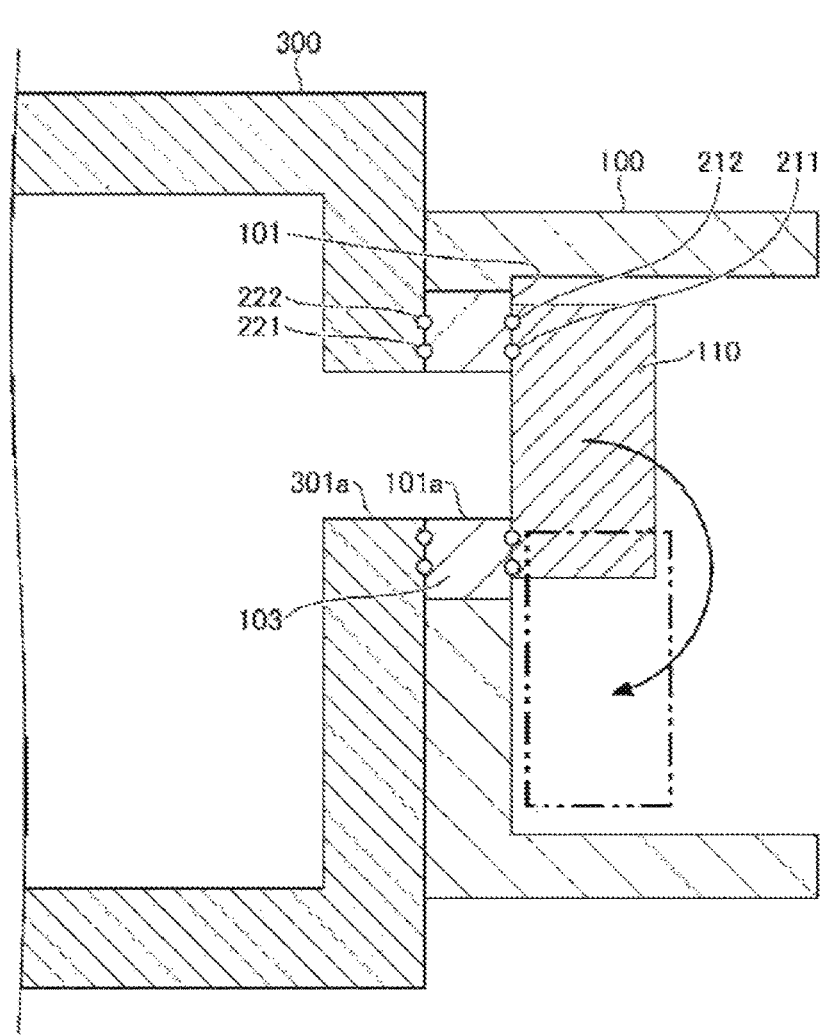
FIG. 6 is an example of a cross-sectional view taken along line VI-VI in FIG. 5.

Next, the gate valve GV according to the present embodiment will be described with reference to FIGS. 2 to 6. FIGS. 2 and 3 are examples of front views of the gate valve GV according to the present embodiment. FIGS. 4 and 5 are examples of cross-sectional views of the gate valve GV according to the present embodiment. FIG. 6 is an example of a cross-sectional view taken along line VI-VI in FIG. 5. FIGS. 2 and 4 illustrate a state where an opening 101a is opened, and FIGS. 3 and 5 illustrate a state where the opening 101a is closed. Further, FIG. 6 illustrates a position of a valve body 110 in a state where the opening 101a is closed by using a solid line, and illustrates the position of the valve body 110 in a state where the opening 101a is opened by using a two-dot chain line.

The gate valve GV is a rectangular gate valve. The gate valve GV is provided between the transfer chamber VTM and the chambers (substrate processing chambers PM1 to PM6 and load-lock chambers LLM1 and LLM2) disposed adjacent to the transfer chamber VTM. The gate valve GV according to the present embodiment may be applied as a door valve (not illustrated) provided between the loader module LM and the load-lock chambers LLM1 and LLM2. The gate valve GV includes a housing 100, the valve body 110, and drive portions 120. Further, the drive portions 120 are respectively provided on the left and right sides of the valve body 110.

The housing 100 accommodates the valve body 110. The housing 100 includes a shield wall 101 having the opening 101a. The shield wall 101 is disposed to shield spaces between one chamber (for example, the transfer chamber VTM) and other chambers (for example, the substrate processing chambers PM1 to PM6 and the load-lock chambers LLM1 and LLM2). The opening 101a is formed in a rectangular shape having a horizontal direction as a longer side direction and having a vertical direction as a shorter side direction when viewed from the front side (see, for example, FIGS. 2 and 3) such that picks C and D holding the wafer W can be transferred.

The housing 100 has side walls 102 respectively on the left and right sides in the horizontal direction when viewed from the front side (see FIGS. 2 and 3). The outsides of the side walls 102 respectively have drive portion accommodating portions 121 that each accommodate an orthogonal gearbox 150 and an actuator 160 of the drive portion 120.

The valve body 110 is provided in the housing 100 to open and close the opening 101a. That is, the valve body 110 is provided to be movable between a shield position (see, the valve bodies 110 illustrated by solid lines in FIGS. 3, 5, and 6) for closing the opening 101a, and an open position (see, the valve bodies 110 illustrated by the two-dot chain lines in FIGS. 2, 4, and 6) for opening the opening 101a. Further, a sealing member (not illustrated) is provided on a surface of the valve body 110 in contact with the shield wall 101. Thereby, the opening 101a is closed by the valve body 110, and by pushing the valve body 110 toward the shield wall 101, the opening 101a can be airtightly closed.

As illustrated in FIGS. 4 and 5, the drive portion 120 drives the valve body 110. The drive portion 120 includes first and second crankshafts 131 and 132, a rotation transmission portion 140, the orthogonal gearbox 150, and the actuator 160.

The first crankshaft 131 includes a first output shaft 131*a* and a first input shaft 131*b*. A central axis of the first output shaft 131*a* is parallel to a central axis of the first input shaft 131*b*, and there is a distance between the central axis of the first output shaft 131*a* and the central axis of the first input shaft 131*b*. The first output shaft 131*a* is rotatably supported on an upper side surface of the valve body 110. The first output shaft 131*a* is supported by a bearing (not illustrated) provided in the valve body 110. The first input shaft 131*b* penetrates the side wall 102 of the housing 100 and is rotatably supported by a bearing 170 provided in the side wall 102. Further, a sealing member 180 is provided between the side wall 102 and the first input shaft 131*b* so that the inside of the housing 100 is made airtight.

The second crankshaft 132 includes a second output shaft 132*a* and a second input shaft 132*b*. A central axis of the second output shaft 132*a* is parallel to a central axis of the second input shaft 132*b*, and there is a distance between the central axis of the second output shaft 132*a* and the central axis of the second input shaft 132*b*. The second output shaft 132*a* is rotatably supported on a lower side surface of the valve body 110. The second output shaft 132*a* is supported by a bearing (not illustrated) provided in the valve body 110. The second input shaft 132*b* penetrates the side wall 102 of the housing 100 and is rotatably supported by the bearing 170 provided in the side wall 102. Further, the sealing member 180 is provided between the side wall 102 and the second input shaft 132*b* so that the inside of the housing 100 is made airtight.

The central axis of the first input shaft 131*b* of the first crankshaft 131 extends on the left and right sides in the horizontal direction when viewed from the front side (see FIGS. 2 and 3). In other words, the central axis of the first input shaft 131*b* is disposed to be parallel to the longer side direction of the opening 101*a*. Further, the central axis of the second input shaft 132*b* of the second crankshaft 132 extends on the left and right sides in the horizontal direction when viewed from the front side (see FIGS. 2 and 3). In other words, the central axis of the second input shaft 132*b* is disposed to be parallel to the longer side direction of the opening 101*a*.

The first input shaft 131*b* of the first crankshaft 131 and the second input shaft 132*b* of the second crankshaft 132 are vertically separated from each other.

The rotation transmission portion 140 transmits a rotation of the first input shaft 131*b* of the first crankshaft 131 to the second input shaft 132*b* of the second crankshaft 132. The rotation transmission portion 140 includes a timing pulley 141 provided to the first input shaft 131*b*, a timing pulley 142 provided to the second input shaft 132*b*, and a timing belt 143 provided between the timing pulley 141 and the timing pulley 142. Thereby, when the first input shaft 131*b* rotates, the second input shaft 132*b* also rotates in synchronization therewith.

The orthogonal gearbox 150 receives a rotational motion with the vertical direction as a rotation axis, and outputs a rotational motion with the horizontal direction as the rotation axis. Further, the orthogonal gearbox 150 may be a decelerator. The orthogonal gearbox 150 has an input side connected to a rotation axis of the actuator 160 and has an output side connected to the first input shaft 131*b* of the first crankshaft 131.

The actuator 160 rotates the first input shaft 131*b* through the orthogonal gearbox 150. The actuator 160 is, for example, a rotary actuator such as a motor. The rotation axis of the actuator 160 extends in the vertical direction when viewed from the front side (see FIGS. 2 and 3). That is, the actuator 160 is disposed such that the rotation axis of the actuator 160 is orthogonal to the first input shaft 131*b* of the first crankshaft 131.

The drive portion 120 provided on the left side of the gate valve GV when viewed from the front side (see FIGS. 2 and 3) is described with reference to FIGS. 4 and 5, and the same applies to the drive portion 120 provided on the right side, and accordingly, redundant descriptions thereof are omitted.

The orthogonal gearbox 150 and the actuator 160 may be configured to be provided in only one of the drive portions 120 provided to the left and the right.

Here, the actuator 160 is rotated in one direction to rotate the first input shaft 131*b* of the first crankshaft 131 in one direction (a clockwise direction when viewed from the direction of FIG. 6). Thereby, the second input shaft 132*b* of the second crankshaft 132 also rotates in one direction (a clockwise direction when viewed from the direction of FIG. 6) through the rotation transmission portion 140.

Accordingly, the first output shaft 131*a* of the first crankshaft 131 rotates in a clockwise direction with the first input shaft 131*b* as a rotation axis, and the second output shaft 132*a* of the second crankshaft 132 rotates in a clockwise direction with the second input shaft 132*b* as a rotation axis. Thereby, as illustrated by an arrow in FIG. 6, the valve body 110 moves along an arc, thereby being able to be moved from the shield position to the open position. That is, the opening 101*a* can be opened.

Further, the actuator 160 is rotated in a reverse direction of the one direction to rotate the first input shaft 131*b* of the first crankshaft 131 in the reverse direction (a counterclockwise direction when viewed from the direction of FIG. 6). Thereby, the second input shaft 132*b* of the second crankshaft 132 also rotates in the reverse direction (the counterclockwise direction when viewed from the direction of FIG. 6) through the rotation transmission portion 140.

Accordingly, the first output shaft 131*a* of the first crankshaft 131 rotates in a counterclockwise direction with the first input shaft 131*b* as a rotation axis, and the second output shaft 132*a* of the second crankshaft 132 rotates in the counterclockwise direction with the second input shaft 132*b* as a rotation axis. Thereby, the valve body 110 can move along the arc in a direction opposite to a direction indicated by the arrow illustrated in FIG. 6, and the valve body 110 can move from the open position to the shield position. That is, the opening 101*a* can be shielded by the valve body 110.

Then, by further rotating the actuator 160 in the reverse direction, the valve body 110 can be pushed toward the shield wall 101 having the opening 101*a*. Thereby, the opening 101*a* can be airtightly closed.

In this way, according to the gate valve GV of the present embodiment, the opening and closing operations of the valve body 110 and an operation of pushing the valve body 110 toward the shield wall 101 having the opening 101*a* can be performed by one actuator 160.

Further, as illustrated in FIG. 6, a processing container 300 which is each of the substrate processing chambers PM1 to PM6 or the load-lock chambers LLM1 and LLM2 has a container opening 301*a* for carrying the wafer W into and out of the processing container 300. The processing container 300 is formed of, for example, a metal material such as aluminum of which inner side is anodized (alumite-processed) and is electrically grounded. The housing 100 of the gate valve GV includes a valve seat plate 103 serving as a valve body receiving member. The valve seat plate 103 is disposed around the container opening 301*a* outside a side wall of the processing container 300. The valve seat plate 103 has a frame shape and the opening 101*a* having substantially the same size as the container opening 301a. A size of the opening 101a is preferably the same as or larger than a size of the container opening 301a. The valve seat plate 103 is disposed such that the opening 101a communicates with the container opening 301a. The valve seat plate 103 is formed of a conductive material such as metal. The valve seat plate 103 is interposed between the valve body 110 and the processing container 300 in a state where the opening 101a and the container opening 301a are closed by the valve body 110.

An O-ring 211 serving as a first airtight sealing member is attached to the valve seat plate 103. The O-ring 211 is fitted to a groove (not illustrated) formed in the valve seat plate 103. The O-ring 211 is provided to surround the entire periphery of the opening 101a of the valve seat plate 103. The O-ring 211 is interposed between the valve body 110 and the valve seat plate 103 in a state where the opening 101a and the container opening 301a are closed by the valve body 110. In this way, the O-ring 211 is interposed between the valve body 110 and the valve seat plate 103 to airtightly seal a space therebetween in a state where the opening 101a and the container opening 301a are closed by the valve body 110. The O-ring 211 can also be provided on the valve body 110 side.

A shield ring 212 serving as a first conductive member is attached to the valve seat plate 103. The shield ring 212 is fitted to a groove (not illustrated) formed in the valve seat plate 103. The shield ring 212 is formed of a conductive material such as a metal and is provided to surround the entire periphery of the opening 101a of the valve seat plate 103. The shield ring 212 is interposed between the valve body 110 and the valve seat plate 103 in a state where the opening 101a and the container opening 301a are closed by the valve body 110. In this way, the shield ring 212 is interposed between the valve body 110 and the valve seat plate 103 to be electrically connected to each other in a state where the opening 101a and the container opening 301a are closed by the valve body 110. Here, the term "electrically connected" means that electric charges move between the members connected to each other and potentials thereof are equal to each other. The shield ring 212 may also be provided on the valve body 110 side.

The O-ring 211 is provided to surround the entire periphery of the opening 101a of the valve seat plate 103, and furthermore, is disposed such that the shield ring 212 surrounds the outside of the O-ring 211. Dispositions of the O-ring 211 and the shield ring 212 may be reversed to each other. That is, the shield ring 212 may be provided to surround the entire periphery of the opening 101a of the valve seat plate 103, and the O-ring 211 may be provided to surround the outside of the shield ring 212.

An O-ring 221 serving as a second airtight sealing member is attached to the valve seat plate 103. The O-ring 221 is fitted to a groove (not illustrated) formed in the valve seat plate 103. The O-ring 221 is provided to surround the entire periphery of the container opening 301a. The O-ring 221 is interposed between the valve seat plate 103 and a surface a periphery of the container opening 301a on the side wall of the processing container 300. In this way, the O-ring 221 is interposed between the valve seat plate 103 and the processing container 300 to airtightly seal a space therebetween. The O-ring 221 can also be provided on the side wall of the processing container 300.

A shield ring 222 serving as a second conductive member is attached to the valve seat plate 103. The shield ring 222 is fitted to a groove (not illustrated) formed in the valve seat plate 103. The shield ring 222 is formed of a conductive material such as a metal and is provided to surround the entire periphery of the container opening 301a. The shield ring 222 is interposed between the valve seat plate 103 and the surface of the periphery of the container opening 301a on the side wall of the processing container 300. In this way, the shield ring 222 is interposed between the valve seat plate 103 and the processing container 300 to be electrically connected to each other. The shield ring 222 can also be provided on the side wall side of the processing container 300.

The O-ring 221 is provided to surround the entire periphery of the opening 101a of the valve seat plate 103 and the entire periphery of the container opening 301a, and furthermore, the shield ring 222 is disposed to surround the outside of the O-ring 221. Dispositions of the O-ring 221 and the shield ring 222 may be reversed to each other. That is, the shield ring 222 may be provided to surround the entire periphery of the opening 101a of the valve seat plate 103 and the entire periphery of the container opening 301a, and the O-ring 221 may be provided to surround the outside of the shield ring 222.

All of the shield ring 212 which is the first conductive member and the shield ring 222 which is the second conductive member may be members having an electromagnetic wave sealing function. For example, a spiral spring gasket made by spirally forming a thin metal plate of stainless steel or the like may be preferably used as the shield rings 212 and 222.

As described above, in a state where the opening 101a and the container opening 301a are closed by the valve body 110, spaces between the processing container 300, the valve seat plate 103, and the valve body 110 are airtightly sealed by the two O-rings 211 and 221, and the airtightness of the processing container 300 is held. Further, in a state where the opening 101a and the container opening 301a are closed by the valve body 110, the processing container 300, the valve seat plate 103, and the valve body 110 are conducted to each other by the two shield rings 212 and 222, and are electrically connected to each other. Thereby, in a state where the opening 101a and the container opening 301a are closed by the valve body 110, the valve body 110 has the same ground potential as the processing container 300.

Here, in a case where the processing container 300 is the substrate processing chambers PM1 to PM6 in which a plasma process of the wafer W is performed, when the valve body 110 made of a metal such as aluminum is in an electrically floating state, there is a concern that abnormal discharging occurs or local plasma is generated near the valve body 110 during the plasma process. In contrast to this, in a state where the opening 101a and the container opening 301a are closed by the valve body 110, the gate valve GV has the valve seat plate 103 and the two shield rings 212, 222 interposed therebetween, and thereby, the valve body 110 is conducted to the processing container 300 to prevent abnormal discharging from occurring and local plasma from being generated.

Further, both the valve seat plate 103 and the two shield rings 212 and 222 are formed of the same type of metal material. Here, "the same type of metal material" means a) that types of the contained main elements are the same as each other, b) that types of the contained elements are preferably the same as each other, and c) that types of the contained elements are preferably the same as each other and content ratios thereof are also preferably the same as each other. Further, in the case of a) above, the "main element" refers to an element contained in, for example, a metal material in an amount of 70% by mass or more, and the types of elements contained therein in a trace amount may be different from each other. In the case of b) above, the content ratios of the elements may be different from each other. The valve seat plate 103 and the two shield rings 212 and 222 are formed of, for example, stainless steel. By using the same type of metal material for the valve seat plate 103 and the two shield rings 212 and 222, generation of metal particles can be suppressed.

Figure 7:
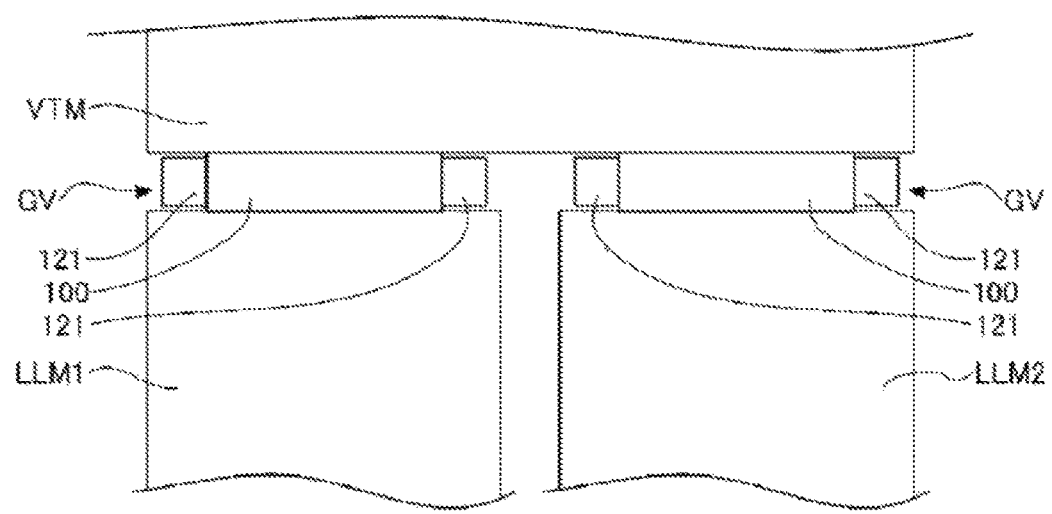
FIG. 7 is an example of a top view of a semiconductor manufacturing apparatus according to the first embodiment including the gate valve according to the present embodiment.
Figure 8:
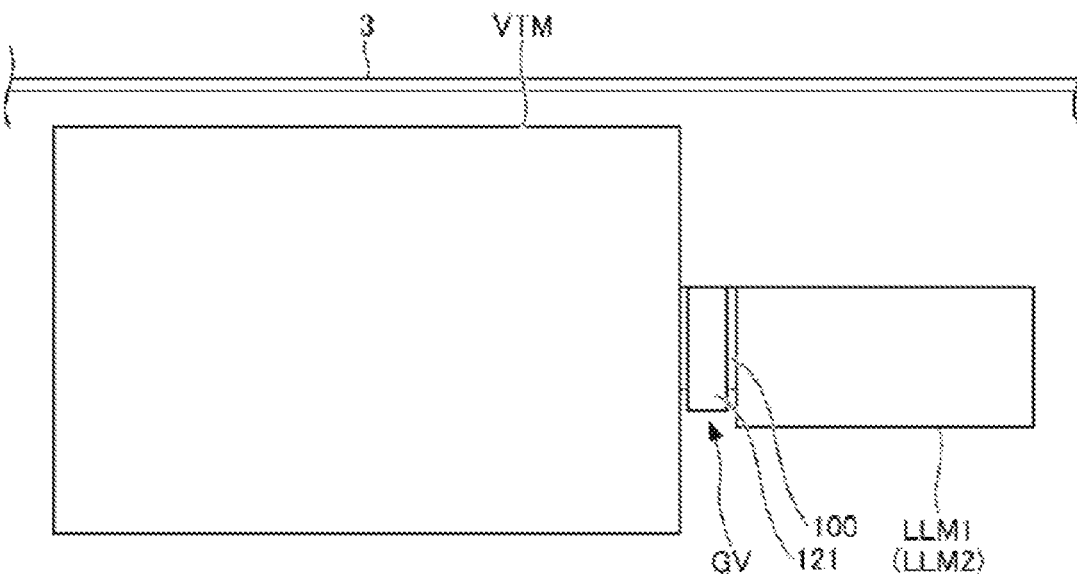
FIG. 8 is an example of a side view of the semiconductor manufacturing apparatus according to the first embodiment including the gate valve according to the present embodiment.

FIG. 7 is an example of a top view of the semiconductor manufacturing apparatus 1 according to the first embodiment including the gate valve GV according to the present embodiment. FIG. 8 is an example of a side view of the semiconductor manufacturing apparatus 1 according to the first embodiment including the gate valve GV according to the present embodiment. Here, the gate valve GV provided between the transfer chamber VTM and the load-lock chambers LLM1 and LLM2 will be described by way of example of the gate valve GV.

In FIGS. 1, 7, and 8, the semiconductor manufacturing apparatus 1 according to the first embodiment includes the load-lock chambers LLM1 and LLM2 in a horizontal direction (lateral direction).

As illustrated in FIGS. 4 and 5, the gate valve GV can include the orthogonal gearbox 150 to allow an axial direction of the actuator 160 to be in the vertical direction. Thereby, a width of the gate valve GV in a left-right direction can be suppressed. Therefore, as illustrated in FIG. 7, in a configuration in which the load-lock chambers LLM1 and LLM2 are arranged in the horizontal direction, the gate valve GV provided between the load-lock chamber LLM1 and the transfer chamber VTM, and the gate valve GV provided between the load-lock chamber LLM2 and the transfer chamber VTM can be prevented from interference.

Further, as illustrated in FIG. 8, the drive portion accommodating portion 121 is provided on a side surface of the housing 100, and accordingly, a height of the gate valve GV can be reduced.

Further, the gate valve GV of the present embodiment can perform opening and closing operations of the valve body 110 and an operation of pushing the gate valve GV toward the shield wall 101 according to rotational motions of the first and second crankshafts 131 and 132. Thereby, the valve body 110 can be driven without using a complicated operation mechanism.

Further, the gate valve GV of the present embodiment can control the force that pushes the valve body 110 toward the shield wall 101 by using the actuator 160.

Although a case where the semiconductor manufacturing apparatus 1 includes two chambers (load-lock chambers LLM1 and LLM2) provided in the horizontal direction (lateral direction) in FIGS. 7 and 8 is described as an example, the present disclosure is not limited thereto. The semiconductor manufacturing apparatus 1 may include a plurality of chambers, and at least two of the plurality of chambers may be provided in the horizontal direction (lateral direction).

[Entire Configuration of Semiconductor Manufacturing Apparatus According to Second Embodiment]

Figure 9:
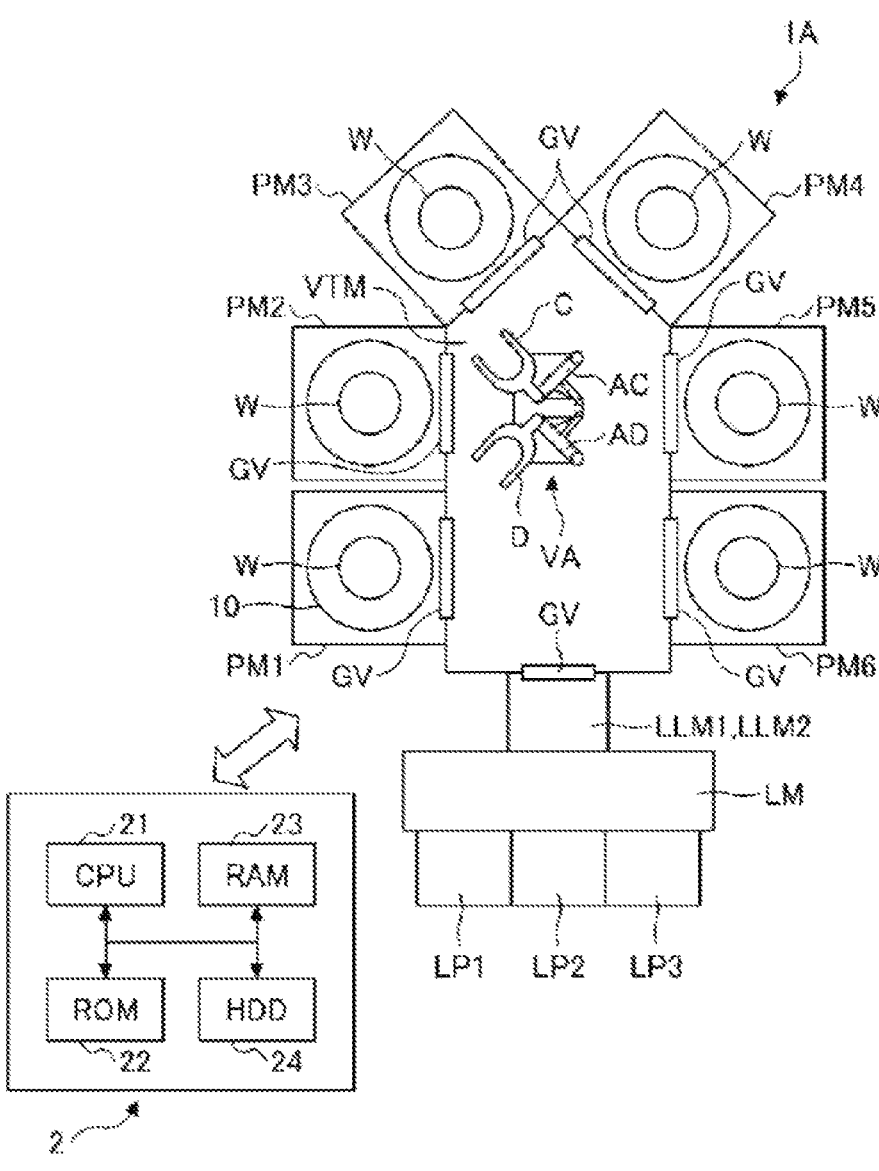
FIG. 9 is a view illustrating an example of the entire configuration of a semiconductor manufacturing apparatus according to a second embodiment.

Next, a semiconductor manufacturing apparatus 1A according to a second embodiment including the gate valve GV according to the present embodiment will be described. FIG. 9 is a view illustrating an example of the entire configuration of the semiconductor manufacturing apparatus 1A according to the second embodiment.

The semiconductor manufacturing apparatus 1A according to the second embodiment includes substrate processing chambers PM1 to PM6, a transfer chamber VTM, load-lock chambers LLM1 and LLM2, a loader module LM, and load ports LP1 to LP3. Here, in the semiconductor manufacturing apparatus 1A according to the second embodiment, the load-lock chambers LLM1 and LLM2 are disposed side by side in the vertical direction (longitudinal direction) on one side wall of the transfer chamber VTM. The other configurations are the same as the configurations of the semiconductor manufacturing apparatus 1 (see, FIG. 1) according to the first embodiment, and redundant descriptions thereof are omitted.

Figure 10:
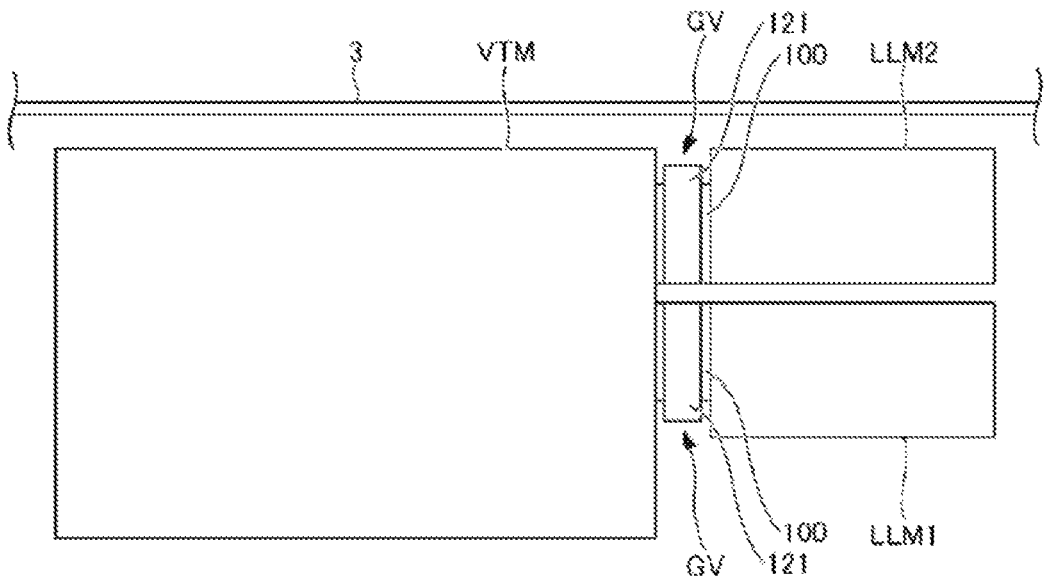
FIG. 10 is an example of a side view of a semiconductor manufacturing apparatus according to the second embodiment including the gate valve according to the present embodiment.
Figure 11:
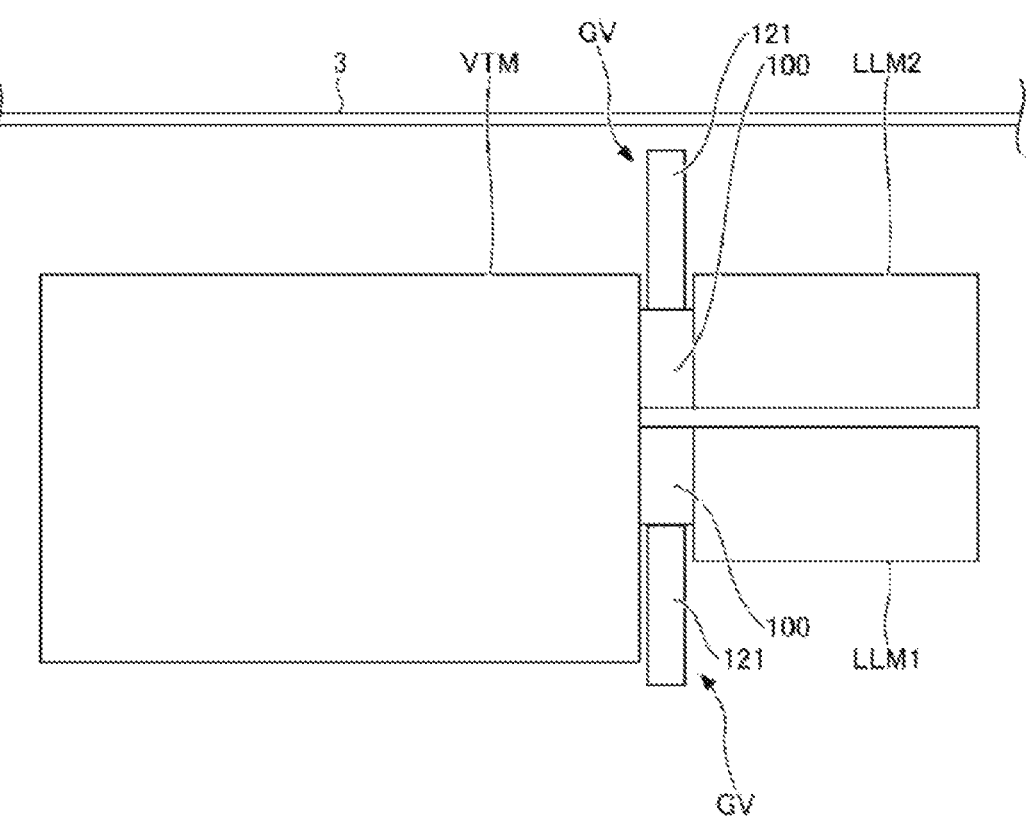
FIG. 11 is an example of a side view of a semiconductor manufacturing apparatus including a gate valve according to a reference example.

FIG. 10 is an example of a side view of the semiconductor manufacturing apparatus 1A according to the second embodiment including the gate valve GV according to the present embodiment. FIG. 11 is an example of a side view of the semiconductor manufacturing apparatus 1A according to the second embodiment including a gate valve GV according to a reference example. Here, the gate valve GV provided between the transfer chamber VTM and the load-lock chambers LLM1 and LLM2 will be described by way of example of the gate valve GV.

In FIGS. 9, 10, and 11, the semiconductor manufacturing apparatus 1A according to the second embodiment includes the load-lock chambers LLM1, LLM2 provided in the vertical direction (longitudinal direction).

Here, the gate valve GV according to the reference example includes a direct-acting actuator (not illustrated) that moves a valve body in an opening/closing direction. Accordingly, as illustrated in FIG. 11, according to the reference example, the drive portion accommodating portion 121 of the gate valve GV provided to the load-lock chamber LLM1 at a lower stage is provided below the housing 100. Further, the drive portion accommodating portion 121 of the gate valve GV provided to for the load-lock chamber LLM2 at an upper stage is provided above the housing 100.

Accordingly, as illustrated in FIG. 11, a cover member 3 of the semiconductor manufacturing apparatus 1A of the reference example is disposed at a high position. Alternatively, an overhanging portion (not illustrated) needs to be provided in the cover member 3. Accordingly, the entire volume of the semiconductor manufacturing apparatus 1A increases.

Meanwhile, as illustrated in FIG. 10, according to the present embodiment, the drive portion accommodating portion 121 of the gate valve GV provided to the load-lock chamber LLM1 at the lower stage is provided on the side of the housing 100. Further, the drive portion accommodating portion 121 of the gate valve GV provided to the load-lock chamber LLM2 at the upper stage is provided on the side of the housing 100.

Accordingly, as illustrated in FIG. 10, the cover member 3 of the semiconductor manufacturing apparatus 1A of the present embodiment can be disposed at a position lower than the position in the reference example. Further, the cover member 3 may be flattened without providing an overhanging portion (not illustrated). Thereby, the entire volume of the semiconductor manufacturing apparatus 1A can be reduced.

Although a case where the semiconductor manufacturing apparatus 1A includes two chambers (the load-lock chambers LLM1 and LLM2) provided in the vertical direction (longitudinal direction) in FIGS. 9 and 10 is described as an example, the present disclosure is not limited thereto. The semiconductor manufacturing apparatus 1A may include a plurality of chambers, and at least two of the plurality of chambers may be provided in the vertical direction (longitudinal direction).

Further, although a case where the gate valves GV are provided respectively between the substrate processing chambers PM1 to PM6 and the transfer chamber VTM and between the load-lock chambers LLM1 and LLM2 and the transfer chamber VTM is described as an example, the present disclosure is not limited thereto. In a configuration in which the semiconductor manufacturing apparatus 1A includes another transfer chamber different from the transfer chamber VTM and the transfer chamber VTM and another transfer chamber are disposed adjacent to each other, the gate valve GV of the present embodiment may be provided between the transfer chamber VTM and another transfer chamber.

As such, although the embodiments of the gate valve and the like are described above, the present disclosure is not limited to the above-described embodiments and the like, and various modifications and improvements can be made within the scope of the gist of the present disclosure described in the scope of the claims.

The invention claimed is:

1. A gate valve apparatus comprising:
a housing having an opening;
a valve body configured to open and close the opening; and
a drive portion configured to drive the valve body, wherein the drive portion includes:
    a first crankshaft including a first input shaft rotatably supported by a side wall of the housing and a first output shaft rotatably supported by the valve body;
    a second crankshaft including a second input shaft rotatably supported by the side wall of the housing and a second output shaft rotatably supported by the valve body;
    a rotation transmission portion configured to transmit rotation of the first input shaft to the second input shaft, the rotation transmission portion including:
    a first timing pulley attached to the first input shaft;
    a second timing pulley provided to the second input shaft; and
    a timing belt connecting the first timing pulley to the second timing pulley, the rotation transmission portion synchronizing rotation of the first input shaft and the second input shaft; and
an actuator connected to the first input shaft to rotate the first input shaft to cause the valve body to move along an arc to open and close the opening.

2. The gate valve apparatus according to claim 1, wherein a rotation axis of the actuator and the first input shaft are disposed to be orthogonal to each other, and
the drive portion further includes an orthogonal gearbox which receives a rotation of the rotation axis of the actuator and outputs a rotation of the first input shaft.

3. The gate valve apparatus according to claim 1, wherein the central axis of the first input shaft is disposed to parallel to a longer side direction of the opening.

4. The gate valve apparatus according to claim 1, further comprising:
a conductive valve body receiving member having the opening communicating with a container opening through which a substrate is carried into and out of a processing container and interposed between the valve body and the processing container in a state in which the opening is closed by the valve body;
a first airtight sealing member interposed between the valve body and the valve body receiving member to airtightly seal a space therebetween in the state in which the opening is closed by the valve body;

a first conductive member interposed between the valve body and the valve body receiving member to electrically connect the valve body to the valve body receiving member in the state in which the opening is closed by the valve body;
a second airtight sealing member provided to surround the opening and interposed between the valve body receiving member and the housing to airtightly seal a space therebetween; and
a second conductive member provided to surround the opening and interposed between the valve body receiving member and the housing to electrically connect the valve body receiving member to the housing.

5. The gate valve apparatus according to claim 4, wherein the first conductive member and the second conductive member are formed of the same material.

6. The gate valve apparatus according to claim 4, wherein the first conductive member is provided to surround the first airtight sealing member in the state in which the opening is closed by the valve body.

7. The gate valve apparatus according to claim 4, wherein the second conductive member is provided to surround the second airtight sealing member.

8. The gate valve apparatus according to claim 4, wherein each of the first airtight sealing member and the second airtight sealing member is an O-ring.

9. A semiconductor manufacturing apparatus comprising:
a transfer chamber;
a chamber disposed adjacent to the transfer chamber; and
the gate valve apparatus according to claim 1, which is provided between the transfer chamber and the chamber.

10. The semiconductor manufacturing apparatus according to claim 9, wherein a rotation axis of the actuator and the first input shaft are disposed to be orthogonal to each other, and
the drive portion further includes an orthogonal gearbox which receives a rotation of the rotation axis of the actuator and outputs a rotation of the first input shaft.

11. The semiconductor manufacturing apparatus according to claim 9, wherein the chamber is a substrate processing chamber.

12. The semiconductor manufacturing apparatus according to claim 9, wherein the chamber is a load-lock chamber.

13. The semiconductor manufacturing apparatus according to claim 9, wherein the chamber is another transfer chamber different from the transfer chamber.

14. The semiconductor manufacturing apparatus according to claim 9, wherein the semiconductor manufacturing apparatus includes a plurality of the chambers, and
at least two of the plurality of chambers are disposed in a horizontal direction.

15. The semiconductor manufacturing apparatus according to claim 9, wherein the semiconductor manufacturing apparatus includes a plurality of the chambers, and
at least two of the plurality of chambers are disposed in a vertical direction.

16. The semiconductor manufacturing apparatus according to claim 9, wherein the gate valve apparatus further comprises:
a conductive valve body receiving member having the opening communicating with a container opening through which a substrate is carried into and out of a processing container and interposed between the valve body and the processing container in a state in which the opening is closed by the valve body;

a first airtight sealing member interposed between the valve body and the valve body receiving member to airtightly seal a space therebetween in the state in which the opening is closed by the valve body;

a first conductive member interposed between the valve body and the valve body receiving member to electrically connect the valve body to the valve body receiving member in the state in which the opening is closed by the valve body;

a second airtight sealing member provided to surround the opening and interposed between the valve body receiving member and the housing to airtightly seal a space therebetween; and a second conductive member provided to surround the opening and interposed between the valve body receiving member and the housing to electrically connect the valve body receiving member to the housing.

17. The semiconductor manufacturing apparatus according to claim 16, wherein the first conductive member and the second conductive member are formed of the same material.

18. The semiconductor manufacturing apparatus according to claim 16, wherein the first conductive member is provided to surround the first airtight sealing member in the state in which the opening is closed by the valve body.

19. The semiconductor manufacturing apparatus according to claim 16, wherein the second conductive member is provided to surround the second airtight sealing member.

20. The semiconductor manufacturing apparatus according to claim 16, wherein each of the first airtight sealing member and the second airtight sealing member is an O-ring.

*     *     *     *     *

14